US 010147548B2

United States Patent
Katkar et al.

(10) Patent No.: US 10,147,548 B2
(45) Date of Patent: Dec. 4, 2018

(54) CAPACITORS USING POROUS ALUMINA STRUCTURES

(71) Applicant: Invensas Corporation, San Jose, CA (US)

(72) Inventors: Rajesh Katkar, San Jose, CA (US); Cyprian Emeka Uzoh, San Jose, CA (US)

(73) Assignee: Invensas Corporation, San Jose, CA (US)

(*) Notice: Subject to any disclaimer, the term of this patent is extended or adjusted under 35 U.S.C. 154(b) by 287 days.

(21) Appl. No.: 14/733,269

(22) Filed: Jun. 8, 2015

(65) Prior Publication Data

US 2015/0270069 A1 Sep. 24, 2015

Related U.S. Application Data

(62) Division of application No. 13/797,540, filed on Mar. 12, 2013, now Pat. No. 9,076,594.

(51) Int. Cl.
*H01G 4/33* (2006.01)
*H01G 4/08* (2006.01)
(Continued)

(52) U.S. Cl.
CPC .............. *H01G 4/33* (2013.01); *H01G 4/01* (2013.01); *H01G 4/08* (2013.01); *H01G 4/10* (2013.01);
(Continued)

(58) Field of Classification Search
CPC .. H01G 4/06; H01G 4/08; H01G 4/30; H01G 4/228; H01G 4/12; H01G 4/005; H01G 4/38; H01G 4/385
See application file for complete search history.

(56) References Cited

U.S. PATENT DOCUMENTS 5,510,008 A * 4/1996 Sekhar .................. C25C 3/12
204/290.01
5,888,360 A * 3/1999 de Nora .................. C25C 3/08
204/245

(Continued)

OTHER PUBLICATIONS

S. Bandyopadhyay et al., "Electrochemically assembled quasi-periodic quantum dot arrays", Nanotechnology, vol. 7, 1996.
(Continued)

*Primary Examiner* — Nguyen Ha
(74) *Attorney, Agent, or Firm* — Lerner, David, Littenberg, Krumholz & Mentlik, LLP

(57) ABSTRACT

Capacitors and methods of making the same are disclosed herein. In one embodiment, a capacitor comprises a structure having first and second oppositely facing surfaces and a plurality of pores each extending in a first direction from the first surface towards the second surface, and each having pore having insulating material extending along a wall of the pore; a first conductive portion comprising an electrically conductive material extending within at least some of the pores; and a second conductive portion comprising a region of the structure consisting essentially of aluminum surrounding individual pores of the plurality of pores, the second conductive portion electrically isolated from the first conductive portion by the insulating material extending along the walls of the pores.

16 Claims, 3 Drawing Sheets

(51) Int. Cl.
    *H01G 4/01*     (2006.01)
    *H01G 4/10*     (2006.01)
    *H01L 49/02*     (2006.01)
    *H01M 4/80*     (2006.01)
    *H01G 4/38*     (2006.01)

(52) U.S. Cl.
    CPC ............ *H01G 4/385* (2013.01); *H01L 28/60* (2013.01); *H01L 28/92* (2013.01); *H01M 4/80* (2013.01)

(56) References Cited

U.S. PATENT DOCUMENTS

| | | | |
|---|---|---|---|
| 6,387,750 | B1 | 5/2002 | Lai et al. |
| 6,825,080 | B1 | 11/2004 | Yang et al. |
| 6,827,879 | B2 | 12/2004 | Shinozaki et al. |
| 6,961,230 | B2 | 11/2005 | Otsuka et al. |
| 7,355,836 | B2 | 4/2008 | Radhakrishnan et al. |
| 7,457,104 | B2 * | 11/2008 | Lee ............. H01G 4/018 29/25.01 |
| 8,216,712 | B1 | 7/2012 | Ramasubramanian et al. |
| 8,675,346 | B2 | 3/2014 | Dunn et al. |
| 8,912,522 | B2 * | 12/2014 | Rubloff ............. B82Y 10/00 257/14 |
| 2003/0116348 | A1 * | 6/2003 | Nakatani ............. H01G 9/26 174/260 |
| 2005/0266652 | A1 | 12/2005 | Chudzik et al. |
| 2008/0158771 | A1 | 7/2008 | Chinthakindi et al. |
| 2008/0197399 | A1 | 8/2008 | Hsu et al. |
| 2008/0237794 | A1 | 10/2008 | Shoji |
| 2009/0034162 | A1 | 2/2009 | Yawata et al. |
| 2010/0304204 | A1 | 12/2010 | Routkevitch et al. |
| 2011/0027603 | A1 * | 2/2011 | Yaniv ............. C04B 35/522 428/550 |
| 2011/0073827 | A1 | 3/2011 | Rubloff et al. |
| 2011/0080686 | A1 | 4/2011 | Farcy et al. |
| 2013/0224394 | A1 * | 8/2013 | Hanbuecken ......... B82Y 10/00 427/510 |
| 2013/0233600 | A1 * | 9/2013 | Ong ............. H05K 1/053 174/255 |

OTHER PUBLICATIONS

H. He and N.J. Tao, "Electrochemical Fabrication of Metal Nanowires", Encyclopedia of Nanoscience and technology, vol. 2, pp. 755-772, 2004.

International Search Report and Written Opinion for Application No. PCT/US2014/024959 dated Dec. 10, 2014.

* cited by examiner

CAPACITORS USING POROUS ALUMINA STRUCTURES

CROSS REFERENCE TO RELATED APPLICATIONS

The present application is a divisional of U.S. patent application Ser. No. 13/797,540, filed Mar. 12, 2013, the disclosure of which is incorporated herein by reference.

FIELD OF THE INVENTION

The present application describes a capacitor such as that which can be incorporated into active or passive microelectronics assemblies. Specifically, a capacitor and a method of making a capacitor are described herein which can incorporate a structure of alumina and aluminum elements.

BACKGROUND OF THE INVENTION

Capacitors are commonly used for noise suppression, either in signal lines or in power lines. In power lines, noise suppression can be accomplished by mounting many capacitors along the power line to reduce the impedance level. Such capacitor mounting can increase the size and cost of the system, because the cost of mounting the capacitors can be higher than the cost of the capacitors.

Capacitors can be provided on semiconductor chips having active circuit elements, i.e., "active chips" or can be provided on passive chips containing passive circuit elements such as capacitors, inductors, resistors, etc., for mounting to active chips.

Conventional capacitors in silicon can be of two general types. A first type is used to store charge for each bit in a DRAM chip. A second type is capacitors on passive chips, where the primary focus has been on planar capacitors with very thin dielectric materials having a very high dielectric constant, in a single or multi-layer format. Both types of conventional capacitors can have limitations when applied to decoupling capacitor applications. The first type of capacitor may not be well suited for high capacitance applications, because that type is typically meant for usage at bit level and therefore is purposely designed to have a very small size. The first type typically lacks features needed to store or supply sufficient current as a decoupling capacitor. The second type of capacitor may have a low capacitance density and a low quality factor (efficiency).

Despite all of the above-described advances in the art, still further improvements in capacitors and methods of making capacitors would be desirable.

BRIEF SUMMARY OF THE INVENTION

Capacitors and methods of making the same are disclosed herein. In one embodiment, a capacitor can comprise a structure having first and second oppositely facing surfaces and a plurality of pores each extending in a first direction from the first surface towards the second surface. Each pore having insulating material extending along a wall of the pore. A first conductive portion can comprise an electrically conductive material extending within at least some of the pores. A second conductive portion can comprise a region of the structure consisting essentially of aluminum surrounding individual pores of the plurality of pores. The second conductive portion can be electrically isolated from the first conductive portion by the insulating material extending along the walls of the pores.

In one embodiment, each pore may have a diameter of less than two micrometers.

In one embodiment, the insulating material is alumina.

In one embodiment, the capacitor further comprises a first capacitor electrode electrically connected with the first conductive portion; and a second capacitor electrode electrically connected with the second conductive portion, each of the first and second capacitor electrodes being accessible for connection with at least one component external to the capacitor.

In one embodiment, the first capacitor electrode is accessible for connection with the at least one component at a location adjacent to the first surface of the structure.

In one embodiment, the second capacitor electrode is accessible for connection with the at least one component at a location adjacent to the second surface of the structure.

In one embodiment, the second capacitor electrode is accessible for connection with the at least one component at a location adjacent to the first surface of the structure.

In one embodiment, the capacitor further comprises a dielectric material electrically isolating the second conductive portion from the first conductive portion. The dielectric material may have a "high" dielectric constant K signifying a permittivity greater than 3.5 times a permittivity of free space, which in some cases can be greater than 5.0 times, or in particular cases greater than 10 times the permittivity of free space.

In one embodiment, the dielectric material includes at least one material selected from the group consisting of ferroelectric dielectric materials, zeolites, and lead zirconium titanate (PZT).

In one embodiment, the first conductive portion further comprises a plurality of openings disposed in a direction of thickness of the first conductive portion, each opening disposed above and coincident with one of the plurality of pores.

In one embodiment, the electrically conductive material can extend from an interior surface of each opening and along an interior surface of a pore coincident with the opening.

In one embodiment, the capacitor further comprises a dielectric region overlying the first surface, the dielectric region partially surrounding a first region of the first conductive portion and separating the first region of the first conductive portion from the second conductive portion.

In one embodiment, the second conductive portion further comprises a second region overlying the dielectric region; and a plurality of electrically conductive elements extending through the dielectric region in the first direction towards the first surface of the structure, the conductive elements connecting the second region to the region of the structure consisting essentially of aluminum.

In one embodiment, a capacitor can comprise an aluminum substrate having first and second oppositely facing surfaces and a plurality of pores each extending in a first direction from the first surface towards the second surface. Each pore may have insulating material extending along a wall of each pore. The aluminum substrate may have a first portion and a second portion, the second portion electrically isolated from the first portion by the insulating material extending along the walls of the pores. The first portion, the second portion, and the insulating material separating the first portion from the second portion can operate together as a capacitor.

In one embodiment, each pore may have a diameter of less than 2 micrometers.

In one embodiment, the insulating material is alumina.

In one embodiment, at least some of the pores are disposed in an annular pattern, wherein the second conductive portion is separated from the first conductive portion by the annular pattern.

In one embodiment, the capacitor may comprise a first capacitor electrode electrically connected with the first conductive portion. A second capacitor electrode may be electrically connected with the second conductive portion. In one example, each of the first and second capacitor electrodes may be accessible for connection with at least one component external to the capacitor.

In one embodiment, each of the first and second capacitor electrodes are accessible at one of the first or second surfaces for connection with the at least one component.

In one embodiment, the capacitor further comprises a dielectric region overlying the first surface; a plurality of first conductive elements extending through dielectric region in the first direction towards the first surface, to electrically connect the first electrode to the first region; and a plurality of second conductive elements extending through the dielectric region to electrically connect the second electrode to the second region.

In one embodiment, at least some of the plurality of pores are at least partially filled with a non-conductive material.

In one embodiment, a method of fabricating a capacitor can comprise forming a plurality of pores in a structure consisting essentially of aluminum. Each pore may extend in a first direction from a first surface of the region towards a second surface opposite the first surface. Each pore may have a dielectric material extending along a wall of the pore. The forming may be performed such that the insulating material of pores adjacent to one another is merged together to provide a continuous dielectric region, wherein first and second regions of the structure consisting essentially of aluminum are separated from one another by the continuous dielectric region and serve as a first conductive portion and a second conductive portion, respectively, of the capacitor.

In one embodiment, each pore may have a diameter of less than 2 micrometers.

In one embodiment, method of fabricating a capacitor can comprise forming a plurality of pores in a structure consisting essentially of aluminum. Each pore may extend in a first direction from a first surface of the region towards a second surface opposite the first surface. Each pore may have a dielectric material extending along a wall of the pore. An electrically conductive material may be deposited within at least some of the pores to form a first conductive portion. At least a region of the structure consisting essentially of aluminum may serve as a second conductive portion electrically insulated from the first conductive portion by at least the alumina extending along the walls of the pores.

In one embodiment, each pore may have a diameter of less than 2 micrometers.

In one embodiment, the method further comprises depositing a dielectric material within the at least some pores prior to depositing the electrically conductive material to form the first conductive portion.

In one embodiment, the depositing of dielectric material includes depositing at least one material selected from the group consisting of ferroelectric dielectric materials, zeolites, and lead zirconium titanate (PZT).

In one embodiment, the method further comprising reducing a thickness of the alumina within the at least some pores by at least 50% prior to the depositing the dielectric material.

In one embodiment, a capacitor may be formed in an aluminum substrate, the substrate that having a thickness extending from a first surface to a second surface. The capacitor may comprise a first electrically conductive aluminum substrate portion and a second electrically conductive aluminum substrate portion. The capacitor can include a plurality of pores, each pore extending in a first direction from the first surface towards the second surface. The pores may have insulating material extending along a wall of each pore. The insulating material can electrically isolates the first electrically conductive aluminum portion from the second electrically conductive aluminum portion. The first electrically conductive aluminum substrate portion and the second electrically conductive aluminum substrate portion, separated by the insulating material, can operate as a capacitor.

BRIEF DESCRIPTION OF THE DRAWINGS

FIG. 1-2 depicts a top down cross sectional view of a structure comprising porous alumina in accordance with some embodiments of the present invention.

FIG. 1-3 depicts a top down cross sectional view of a structure comprising porous alumina in accordance with some embodiments of the present invention.

FIG. 2-1 depicts capacitor in accordance with some embodiments of the present invention.

FIG. 2-2 depicts capacitor in accordance with some embodiments of the present invention.

FIG. 2-3 depicts capacitor in accordance with some embodiments of the present invention.

FIG. 2-4 depicts capacitor in accordance with some embodiments of the present invention.

DETAILED DESCRIPTION

Capacitors and methods of making the same are disclosed herein. One embodiment of the present invention may advantageously provide capacitors having high aspect ratio features, such as ranging from about 5:1 to about 400:1. One embodiment of the present invention may advantageously provide methods for making capacitors that reduce the number of process steps, for example, such eliminating one or more of dielectric, barrier, seed, or metal deposition. Other and further advantages which may be possible in accordance with particular embodiments of the present invention are discussed herein.

Figure 1:
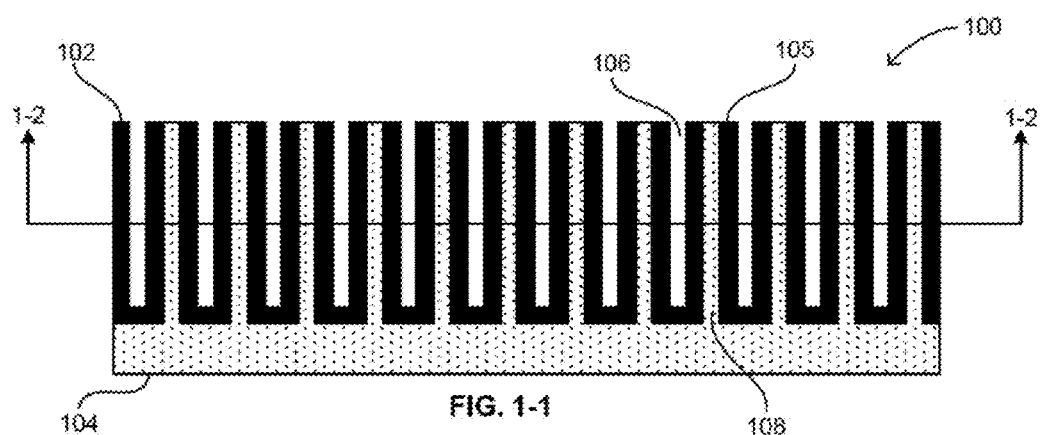
FIG. 1-1 depicts a side schematic view of a structure comprising porous alumina in accordance with some embodiments of the present invention.

FIG. 1-1 depicts a structure comprising a plurality of pores that may be used to form a capacitor in accordance with some embodiments of the present invention. As shown in FIG. 1-1, a structure 100 may include first and second oppositely facing surfaces 102, 104 and a plurality of pores 106, each pore 106 extending in a first direction from the first surface 102 towards the second surface 104 wherein alumina 105 extends along a wall of each pore 106. As used herein, the term 'pore' means an opening that results from a process of selectively oxidizing an aluminum layer, the process converting the aluminum (Al) along the walls of the openings into alumina ($Al_2O_3$). In one embodiment, where pores can be adjacent to each other, the pores should be sufficiently close to each other such that the alumina along the walls of directly adjacent pores merges together in one electrically isolated region. Each pore may have a diameter of less than about 2 micrometers, or ranging from about 0.01 to about 1.95 micrometers.

Figures 1, 2:
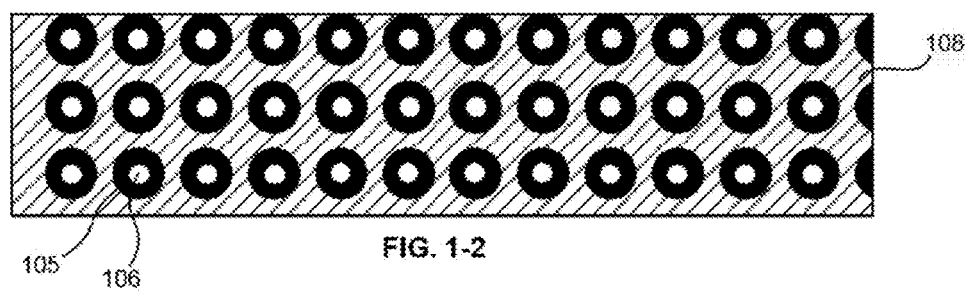
Figures 1, 2, 3:
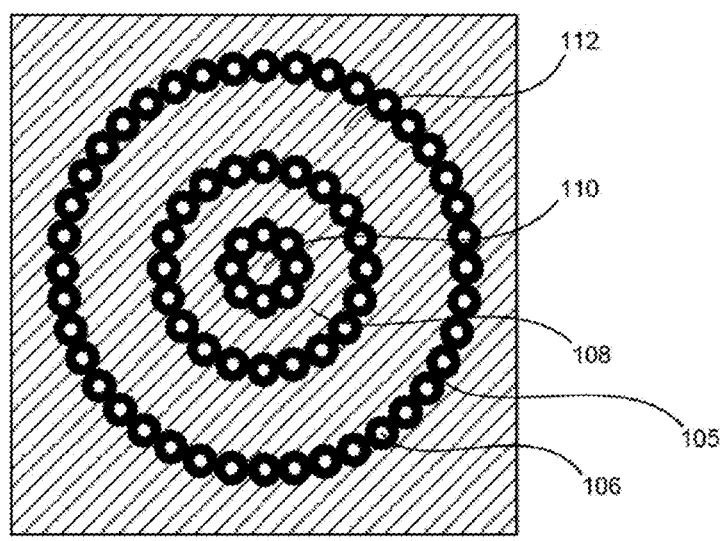

An embodiment provides a capacitor utilizing an alumina region having first and second oppositely facing surfaces and a plurality of pores, each pore extending in a first direction from the first surface towards the second surface and having alumina extending along the walls of the pores. The structure 100 may include a region 108 which consists essentially of aluminum. As illustrated in top down cross section view in FIG. 1-2, the region 108 may surround the individual pores 106 of the plurality of pores 106. However, the structure 100 as illustrated in FIG. 1-2 is merely one exemplary embodiment. Other embodiments are possible, for example, wherein a plurality of pores are surrounded by the region 108. Alternatively, in one embodiment illustrated in top down cross sectional view in FIG. 1-3, the structure 100 may include a second region 110 consisting essentially of aluminum, wherein the second region 110 is surrounded by a plurality of pores 106. The pores 106 should be sufficiently close to each other such that the alumina along the walls of directly adjacent pores merge together in one electrically isolated region. As illustrated in FIG. 1-3, one or more additional regions 112 may surround the first region 108. Each additional region 112 can be electrically isolated from each other by a plurality of pores 106. Although illustrated as a plurality of concentric rings, the regions 108, 110, 112 can be the same or different shapes, and be formed in any desirable shape.

The structure 100 may be formed by a low cost, anodization process that can produce regular and anisotropic pores. An exemplary method of fabricating the structure 100 can include electro-polishing a surface of a substrate consisting essentially of aluminum. Electro-polishing may be utilized to reduce surface roughness to about 100 nanometers or less. In one embodiment, to form the structure 100 a first patterned mask layer may be applied to the electro-polished surface, the patterned mask layer overlying regions of the electro-polished surface where aluminum is to be preserved, such as the region 108 and/or the second region 110 as illustrated in FIGS. 1-2 and 1-3. The substrate may then be electrolyzed using a organic acid solution, such as having a pH of less than about 5 to form the structure 100. One or more process variations may be possible, such as multi-step anodization processes to improve pore uniformity. A more complete description of anodization processes for forming a structure comprising porous alumina can be found in S. Bandyopadhyay et al., Nanotechnology, Vol. 7, 1996, which is incorporated herein by reference.

After formation of the structure 100, a capacitor may be formed from the structure 100. Various embodiments of a capacitor are possible using the structure 100 as illustrated in FIG. 2.

FIGS. 2-1 and 2-2 depict a side schematic view of a capacitor 200 in accordance with some embodiments of the present invention. The capacitor 200 may include a dielectric material 202 overlying the region 108 of the structure 100 at the first surface 102. As used in this disclosure with reference to a substrate, a statement that an element is "at" a surface of a substrate indicates that, when the substrate is not assembled with any other element, the element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

The dielectric material 202 may be the mask layer used to form the structure during the anodization process discuss above. Alternatively, the dielectric material 202 may be added after the structure 100 has been formed. In one embodiment, the dielectric material 202 may further extend along the walls of the pores 106. In one example, the alumina may be at least reduced after the structure 100 has been formed. For example, an etching process, or other suitable removal processes may be used to at least reduce a thickness of the alumina defining the walls of the pores 106 formed during the anodization process. In one embodiment, the structure 100 may be thermally treated to increase the density and/or stabilize the structure 100. The thermal treatment may performed in an oxidizing atmosphere. In one example, the atmosphere may include ammonia ($NH_3$). The dielectric material 202 may be deposited along the walls of the pores 106 and overlying the region 108. The dielectric material may have a dielectric constant K signifying a permittivity greater than about 10 times a permittivity of free space. The dielectric material can include at least one material selected from the group consisting of ferroelectric dielectric materials, zeolites, and lead zirconium titanate (PZT). In some embodiments, the thickness of the alumina within the at least some pores 206 can be reduce prior to depositing the dielectric material 202. In one embodiment, the thickness of the alumina within the at least some pores 206 can be reduced by at least 50% prior to the depositing the dielectric material 202. In yet another example, alumina existing at walls of the pores can be full removed and then the dielectric material 202 can be deposited therein as discussed above.

The capacitor 200 may include a first conductive portion 204 formed by depositing an electrically conductive material 206 within at least some of the pores 106. As illustrated in FIG. 2-1, the electrically conductive material 206 of the first conductive portion 204 may essentially fill the at least some of the pores 106. Further, the electrically conductive material 206 of the first conductive portion 204 may be deposited overlying the dielectric material 202 at the first surface 102.

Alternative embodiments of the first conductive portion 204 are possible. For example, in one embodiment, the first conductive portion 204 may include a plurality of openings 208 disposed in a direction of thickness of the first conductive portion 204 as illustrated in FIG. 2-2. Each opening 208 may be disposed above and coincident with one of the plurality of pores 106. As shown in FIG. 2-2, the electrically conductive material 206 can extend from an interior surface 210 of each opening 208 and along an interior surface of a pore coincident with the opening 208. In one embodiment, at least some of the pores 106 can remain open save for a coating of the electrically conductive material 206 on an interior wall thereof. Alternatively, or in combination with, at least some of the pores 106 can be filled with a dielectric material 212, after the electrically conductive material 206 has been deposited on the interior walls of the pores 106. The dielectric material 212 can be one or more of the materials discussed above for dielectric material 206. The dielectric materials 206, 212 may be the same or different materials.

The capacitor 200 may include a second conductive portion 214 comprising the region 108 consisting essentially of aluminum surrounding individual pores 106 of the plurality of pores 106. The second conductive portion 214 may be formed during the anodization process used to form the structure 100. The second conductive portion 214 may be electrically isolated from the first conductive portion 204 by the alumina and/or dielectric material 202 extending along the walls of the pores and overlying the region 108.

The capacitor 200 may include a first capacitor electrode 216 connected with the first conductive portion 204 and a second capacitor electrode 218 connected with the second conductive portion 214. The first and second capacitor electrodes 216, 218 may be accessible for connection with at least one component external to the capacitor 200.

In one embodiment, as illustrated in FIGS. 2-1 and 2-2, the first capacitor electrode 216 may be accessible for connection with the at least one component at a location adjacent to the first surface 102 of the structure 100. In one embodiment, the second capacitor electrode 218 may be accessible for connection with the at least one component at a location adjacent to the second surface 104 of the structure 100.

Alternatively, in one embodiment, the first and second capacitor electrodes 216, 218 are accessible for connection with the at least one component at a location adjacent to the first surface 102 of the structure 100. For example, as illustrated in FIG. 2-3, the first and second capacitor electrodes 216, 218 may be accessible adjacent to the first surface 102. As shown in FIG. 2-3, a capacitor can include a dielectric region 220 overlying the first surface 102, wherein the dielectric region 220 partially surrounds a first region 222 of the first conductive portion 204 and electrically isolates the first region 222 of the first conductive portion 204 from the second conductive portion 216. In some embodiments, the dielectric region 220 may be used in place of alumina in the pores 106 which may be reduced and/or removed, similar to embodiments discussed above for the dielectric material 206. Alternatively, alumina may extend along the walls of the pores 106, and the dielectric region 220 may overlie the first surface 102. The second conductive portion 214 may include a second region 224 overlying the dielectric region 220. A plurality of conductive elements 226 can extend through the dielectric region 220 in the first direction towards the first surface 102 of the region, the conductive elements connecting the second region 224 to the region 108. For example, the second region 224 can be any suitable means of connecting the second capacitor electrode 218 to the conductive elements 226, such as a trace extending longitudinally at a surface of the dielectric region 220 or other suitable means for connecting.

Figures 1, 2:
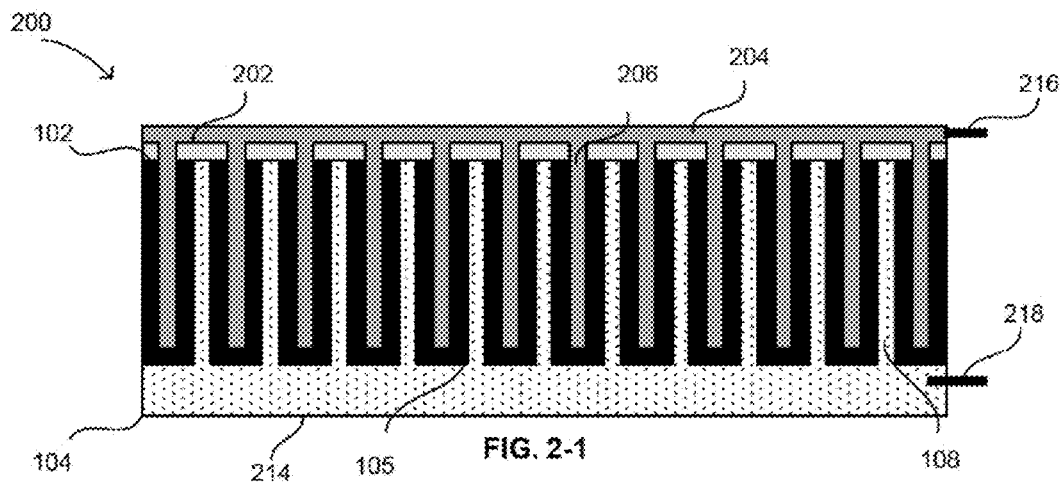
Figure 2:
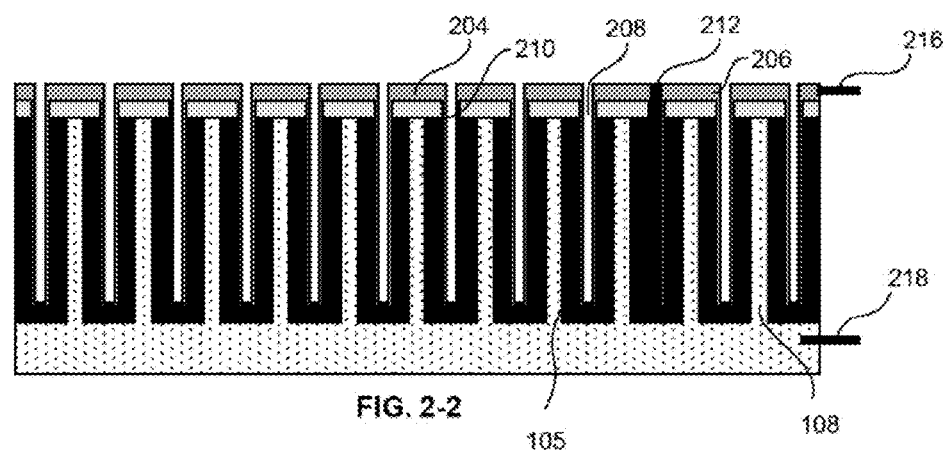
Figures 2, 3:
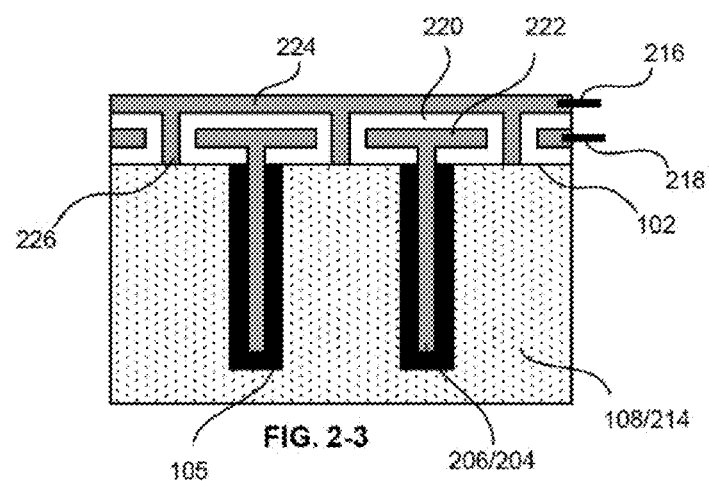
Figures 2, 3, 4:
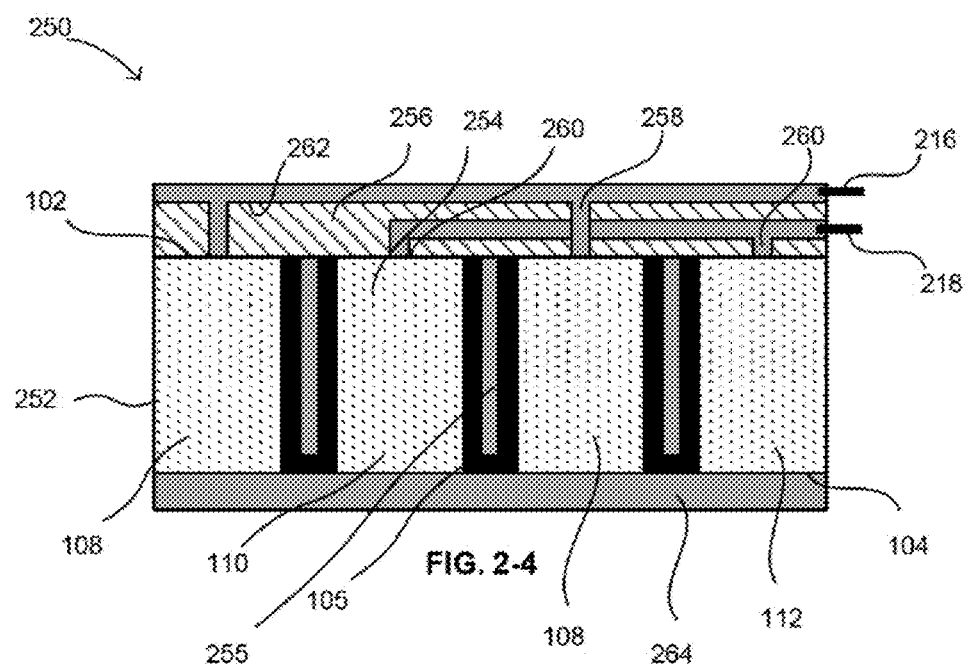

FIG. 2-4 illustrates a capacitor 250 in accordance with some embodiments of the present invention. The capacitor 250 may be formed using the structure 100 as illustrated in FIG. 1-3, the structure 100 including at least the region 108 and the second region 110. In some embodiments, such as depicted in FIG. 1-3, the regions 108, 110, and 112 can be considered as portions of an aluminum substrate, each region electrically isolated from each other by one or more layers of pores 106. As illustrated in FIG. 2-4, a first conductive portion 252 can include the first region 108 of the structure 100 consisting essentially of aluminum.

The capacitor 250 includes a second conductive portion 254, wherein the second conductive portion 254 can include the second region 110 of the region consisting essentially of aluminum. The second conductive portion 254 can be electrically isolated from the first conductive portion 252 by the insulating material extending along the walls of the pores 106. Though illustrated in FIG. 2-4 as a being separated by a single layer of adjacent pores 106, where the insulating material of pores 106 adjacent to one another merges together to provide a continuous dielectric region, there can be multiple layer of pores 106 surrounding the first region 108 and/or the layer(s) of pores 106 can assume any suitable shape in accordance with the shape of the first region 108.

Similar to embodiments discussed above, the dielectric region which separates the first and second conductive portions can be alumina 105. Alternatively, or in combination, the alumina 105 can be replaced with another dielectric material. In one embodiment, at least some of the pores 106 can be at least partially filled with a non-conductive material 255, such as a dielectric material. In one embodiment, at least some of the pores 106 can incorporate voids.

The capacitor 250 can include the first capacitor electrode 216 electrically connected with the first conductive portion 252 and the second capacitor electrode 218 electrically connected with the second conductive portion 254, where each of the first and second capacitor electrodes 252, 254 being accessible for connection with at least one component external to the capacitor 250. Each of the first and second capacitor electrodes may be accessible at one of the first or second surfaces 102, 104 for connection with the at least one component.

In one embodiment, as illustrated in FIG. 2-4, the first and second electrodes 216, 218 are accessible at the first surface 104. The capacitor 250 can include a dielectric region 256 overlying the first surface 102. A plurality of first electrically conductive elements 258 such as vias and traces, can extend through dielectric region 256 in the first direction towards the first surface 102 to electrically connect the first capacitor electrode 216 to the first region 108. A plurality of second electrically conductive elements 260, such as vias and traces, can extend through the dielectric region 256 to electrically connect the second capacitor electrode 218 to the second region 110. In one embodiment, where an additional region 112 is used as illustrated in FIG. 2-4, the additional region 112 can be part of the second conductive portion 254 and electrically connected to the second capacitor electrode 218 through the electrically conductive elements 260 as shown. Additional regions 112 are possible and may be included in the first or second conductive portions 252, 254. The first and second capacitor electrodes 216, 218 may be connected to the first and second electrically conductive elements 258, 260 by any suitable techniques known in the art, such as back end of line (BEOL) or redistribution layer (RDL) processes. For example, as illustrated in FIG. 2-4, the electrically conductive elements may be connected to the respective first and second capacitor electrodes 216, 218 by one or more traces extending longitudinally at a first surface 262 of the dielectric region 256.

As illustrated in FIG. 2-4, the second surface 104 may be ground down until the alumina 105 is exposed at the second surface 104 in the capacitor 250. In one embodiment, the alumina 105 can be used as a polish stop or an end point during backside grinding of the second surface 104. The grinding or other suitable technique can be used to separate the regions 108, 110, 112 such that the first and second conductive portions 252, 254 are electrically isolated. In one embodiment, a dielectric material may be deposited on the second surface 104 after grinding to form a second dielectric region 264 overlying the second surface 104. Although the capacitor 250 illustrates the first and second capacitor electrodes 216, 218 as accessible adjacent to the first surface 102, this is merely one exemplary embodiment. In one embodiment, the first capacitor electrode 216 can be accessible adjacent to the first surface 102 and the second capacitor electrode 218 can be accessible adjacent to the second surface 104. For example, similar to the dielectric region 256, the dielectric region 264 can include one or more conductive elements, such as traces, conductive elements or the like for connecting the second conductive portion 254 to the second capacitor electrode 218 adjacent to the second surface 104.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A capacitor, comprising:
an aluminum substrate having first and second oppositely facing surfaces and a plurality of pores each extending in a first direction from the first surface towards the second surface, and having insulating material extending along a wall of each pore, each of the plurality of pores being filled with at least one of a non-conductive material or voids,
the aluminum substrate having a first portion and a second portion, the second portion electrically isolated from the first portion by the insulating material extending along the walls of the pores; and
wherein the first portion, the second portion, and the insulating material separating the first portion from the second portion operate together as a capacitor.

2. The capacitor of claim 1, wherein each pore has a diameter of less than 2 micrometers.

3. The capacitor of claim 1, wherein the insulating material is alumina.

4. The capacitor as claimed in claim 1, wherein at least some of the pores are disposed in an annular pattern, wherein the second conductive portion is separated from the first conductive portion by the annular pattern.

5. The capacitor of claim 1, further comprising:
a first capacitor electrode electrically connected with the first conductive portion;
a second capacitor electrode electrically connected with the second conductive portion,
each of the first and second capacitor electrodes being accessible for connection with at least one component external to the capacitor.

6. The capacitor of claim 5, wherein each of the first and second capacitor electrodes are accessible at one of the first or second surfaces for connection with the at least one component.

7. The capacitor of claim 1, wherein the plurality of pores form at least a portion of a boundary between the first portion and the second portion.

8. A capacitor, comprising:
an aluminum substrate having first and second oppositely facing surfaces and a plurality of pores each extending in a first direction from the first surface towards the second surface, and having insulating material extending along a wall of each pore,
the aluminum substrate having a first portion and a second portion, the second portion electrically isolated from the first portion by the insulating material extending along the walls of the pores, wherein the first portion, the second portion, and the insulating material separating the first portion from the second portion operate together as a capacitor;
a dielectric region overlying the first surface;
a plurality of first conductive elements extending through dielectric region in the first direction towards the first surface, to electrically connect the first electrode to the first region; and
a plurality of second conductive elements, extending through the dielectric region in the first direction towards the first surface, to electrically connect the second electrode to the second region.

9. A method of fabricating a capacitor, comprising:
forming a plurality of pores in a structure consisting essentially of aluminum, each pore extending in a first direction from a first surface of the region towards a second surface opposite the first surface, and each pore having a dielectric material extending along a wall of the pore, the forming performed such that the insulating material of the pores adjacent to one another is merged together to provide a continuous dielectric region,
wherein first and second regions of the structure consisting essentially of aluminum are separated from one another by the continuous dielectric region and serve as a first conductive portion and a second conductive portion, respectively, of the capacitor.

10. The method of claim 9, wherein each pore having a diameter of less than 2 micrometers.

11. A method of fabricating a capacitor, comprising:
forming a plurality of pores in a structure consisting essentially of aluminum, each pore extending in a first direction from a first surface of the structure towards a second surface opposite the first surface, and having a dielectric material extending along a wall of the pore; and
depositing an electrically conductive material within at least some of the pores to form a first electrically conductive portion,
wherein at least a region of the structure consisting essentially of aluminum serves as a second electrically conductive portion electrically insulated from the first electrically conductive portion by at least the dielectric material extending along the walls of the pores, and
wherein the second electrically conductive portion extends from the first surface towards the second surface between adjacent ones of the plurality of pores.

12. The method of claim 11, wherein each pore having a diameter of less than 2 micrometers.

13. The method of claim 11, further comprising:
depositing the dielectric material within the at least some pores prior to depositing the electrically conductive material to form the first conductive portion.

14. The method of claim 13, wherein the depositing of the dielectric material includes depositing at least one material selected from the group consisting of ferroelectric dielectric materials, zeolites, and lead zirconium titanate (PZT).

15. The method of claim 14, further comprising reducing a thickness of alumina within the at least some pores by at least 50% prior to the depositing of the dielectric material.

16. A capacitor formed in an aluminum substrate, the substrate having a thickness extending from a first surface to a second surface, the capacitor comprising:
a first electrically conductive aluminum substrate portion;
a second electrically conductive aluminum substrate portion; and
a plurality of pores, each pore extending in a first direction from the first surface towards the second surface, and having insulating material extending along a wall of each pore, each of the plurality of pores being filled with at least one of a non-conductive material or voids,
wherein the insulating material electrically isolates the first electrically conductive aluminum portion from the second electrically conductive aluminum portion, and
wherein the first electrically conductive aluminum substrate portion and the second electrically conductive aluminum substrate portion, separated by the insulating material, operate as a capacitor.

* * * * *